(12) United States Patent
Lee et al.

(10) Patent No.: US 8,274,089 B2
(45) Date of Patent: Sep. 25, 2012

(54) LIGHT EMITTING DIODE HAVING LIGHT EMITTING CELL WITH DIFFERENT SIZE AND LIGHT EMITTING DEVICE THEREOF

(75) Inventors: Jun Hee Lee, Ansan-si (KR); Jong Kyu Kim, Ansan-si (KR); Yeo Jin Yoon, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 12/626,556

(22) Filed: Nov. 25, 2009

(65) Prior Publication Data

US 2010/0072494 A1 Mar. 25, 2010

Related U.S. Application Data

(63) Continuation of application No. 12/442,766, filed as application No. PCT/KR2007/004449 on Sep. 14, 2007.

(30) Foreign Application Priority Data

Sep. 30, 2006 (KR) .................. 10-2006-0096759

(51) Int. Cl.
- H01L 29/18 (2006.01)
- H01L 33/00 (2010.01)

(52) U.S. Cl. .................. 257/88; 257/96; 257/E33.006; 257/E33.066

(58) Field of Classification Search .................. None
See application file for complete search history.

(56) References Cited

U.S. PATENT DOCUMENTS

| | | | |
|---|---|---|---|
| 4,857,801 A | | 8/1989 | Farrell |
| 5,864,573 A | * | 1/1999 | Miura et al. ............... 372/45.01 |
| 6,233,265 B1 | * | 5/2001 | Bour et al. ................. 372/45.01 |
| 6,498,355 B1 | * | 12/2002 | Harrah et al. .................... 257/99 |
| 6,649,440 B1 | * | 11/2003 | Krames et al. .................. 438/47 |
| 6,814,801 B2 | | 11/2004 | Jenny et al. |
| 2002/0149938 A1 | * | 10/2002 | Allen ........................... 362/252 |
| 2005/0253151 A1 | * | 11/2005 | Sakai et al. ..................... 257/79 |
| 2006/0063288 A1 | * | 3/2006 | Liu ................................. 438/22 |
| 2006/0163604 A1 | | 7/2006 | Shin |
| 2006/0180818 A1 | * | 8/2006 | Nagai et al. .................... 257/89 |
| 2007/0008722 A1 | * | 1/2007 | Fujino et al. .................. 362/231 |

(Continued)

FOREIGN PATENT DOCUMENTS

EP  1553641  7/2005

(Continued)

OTHER PUBLICATIONS

EPO Office Action for European Patent Application No. EP09 01 4568, dated Jan. 11, 2010.

(Continued)

Primary Examiner — Hoang-Quan Ho
(74) Attorney, Agent, or Firm — H.C. Park & Associates, PLC (57) ABSTRACT

There is provided a light emitting diode operating under AC power comprising a substrate; a buffer layer formed on the substrate; and a plurality of light emitting cells formed on the buffer layer to have different sizes and to be electrically isolated from one another, the plurality of light emitting cells being connected in series through metal wires.

According to the present invention, light emitting cells formed in an LED have different sizes, and thus have different turn-on voltages when light is emitted under AC power, so that times when the respective light emitting cells start emitting light are different to thereby effectively reduce a flicker phenomenon.

19 Claims, 4 Drawing Sheets

U.S. PATENT DOCUMENTS

| | | | |
|---|---|---|---|
| 2007/0029915 A1* | 2/2007 | Kim et al. | 313/483 |
| 2008/0211416 A1 | 9/2008 | Negley et al. | |
| 2009/0206325 A1* | 8/2009 | Biwa et al. | 257/28 |
| 2010/0277084 A1 | 11/2010 | Lee et al. | |

FOREIGN PATENT DOCUMENTS

| | | |
|---|---|---|
| JP | 07-005824 * | 1/1995 |
| JP | 2001-156331 | 6/2001 |
| JP | 2001-307506 | 11/2001 |
| KR | 10-2006-0020089 | 3/2006 |
| WO | 2004-023568 | 3/2004 |
| WO | 2007/001116 | 1/2007 |

OTHER PUBLICATIONS

Supplementary European Search Report for European Patent Application No. EP07 80 8240, dated Dec. 23, 2009.

Heikman, et al., "Growth of Fe Doped Semi-Insulating GaN by Metalorganic Chemical Vapor Deposition," Applied Physics Letters, vol. 81, No. 3, Jul. 15, 2002, pp. 439-441.

U.S. Final Office Action dated May 27, 2010 (from co-pending U.S. Appl. No. 12/442,796).

U.S. Non-Final Office Action dated Dec. 29, 2010 (from co-pending U.S. Appl. No. 12/442,796).

Final Office Action issued on Feb. 17, 2012 in U.S. Appl. No. 12/442,796.

Final Office Action issued on Apr. 17, 2012 in U.S. Appl. No. 12/442,796.

U.S. Non-Final Office Action dated Oct. 19, 2010 (from co-pending U.S. Appl. No. 12/442,796).

Notice of Allowance issued on Jul. 2, 2012 in U.S. Appl. No. 12/442,796.

* cited by examiner

Figure 1

PRIOR ART

Figure 2

PRIOR ART

LIGHT EMITTING DIODE HAVING LIGHT EMITTING CELL WITH DIFFERENT SIZE AND LIGHT EMITTING DEVICE THEREOF

CROSS REFERENCE TO RELATED APPLICATIONS

This application is a continuation of U.S. application Ser. No. 12/442,796, filed on Mar. 25, 2009, which is the National Stage of International Application No. PCT/KR2007/004449, filed Sep. 14, 2007, and claims priority from and the benefit of Korean Patent Application No. 10-2006-0096759, filed on Sep. 30, 2006, which are hereby incorporated by reference for all purposes as if fully set forth herein.

BACKGROUND OF THE INVENTION

1. Field of the Invention

The present invention relates to a light emitting diode having light emitting cells with different sizes and a light emitting device having the same.

2. Discussion of the Background

A light emitting diode (LED), which is a photoelectric conversion device having a structure in which an N-type semiconductor and a P-type semiconductor are joined together, emits predetermined light through recombination of the electrons and holes. Such an LED is widely used for display elements and backlights. Further, LEDs have less electric power consumption and a longer lifespan as compared with conventional light bulbs or fluorescent lamps, so that their application areas have been expanded to the use thereof for general illumination while substituting for conventional incandescent bulbs and fluorescent lamps.

An LED is repeatedly turned on/off depending on the direction of current under an AC power source. Hence, when the LED is directly connected to an AC power source, the LED may not continuously emit light and may be easily damaged due to reverse current.

To solve such a problem, an LED capable of being connected directly to a high-voltage AC power source is disclosed in PCT Patent Publication No. WO 2004/023568 (A1), entitled "LIGHT-EMITTING DEVICE HAVING LIGHT-EMITTING ELEMENTS" by SAKAI et al.

According to PCT Patent Publication No. WO 2004/023568 (A1), LEDs are two-dimensionally connected in series on an insulative substrate such as a sapphire substrate to form LED arrays. Such two LED arrays are connected to each other in reverse parallel on the sapphire substrate. As a result, there is provided a single-chip light emitting diode capable of being directly driven by an AC power supply.

Figure 1:
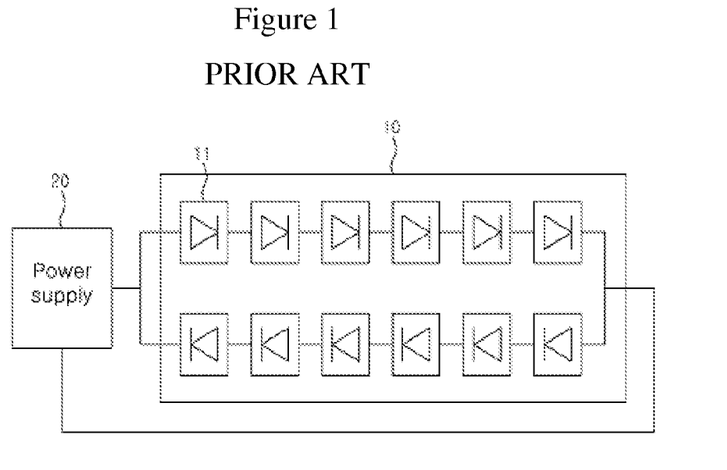
FIG. 1 is a view showing an arrangement of light emitting cells in a conventional LED.

FIG. 1 is a view showing an arrangement of light emitting cells in a conventional LED.

Referring to FIG. 1, a conventional LED 10 performs light emitting operation by AC power supplied from a power supply 20 for supplying AC power.

The LED 10 comprises a plurality of light emitting cells 11 arranged in two parallel rows, where first and second rows are arranged to have polarities opposite to each other.

Hence, if AC power is applied from the power supply 20, current flows into the first row in positive voltage intervals such that the light emitting cells 11 in the first row emit light, and current flows into the second row in negative voltage intervals such that the light emitting cells 11 in the second row emit light.

Therefore, the first and second rows alternately emit light.

The respective light emitting cells 11 of the LED 10 are formed on one substrate through the same process. The respective light emitting cells 11 in the LED 10 are formed to be electrically separated from one another on the substrate and then connected electrically to one another by metal wires.

Figure 2:
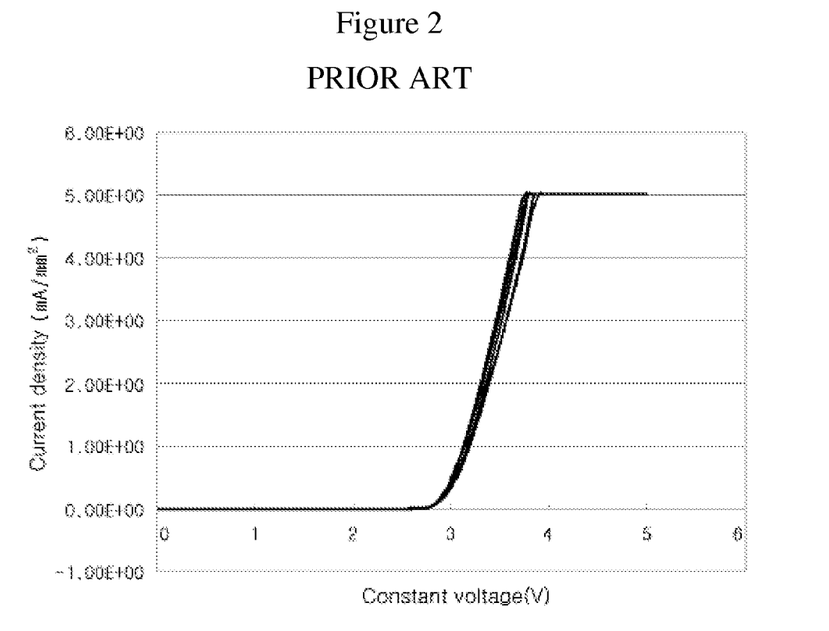
FIG. 2 is a graph showing turn-on voltages of the respective light emitting cells in the conventional LED.

At this time, the respective light emitting cells 11 in the LED 10 have the same size. Hence, the respective light emitting cells 11 have almost the same turn-on voltage as shown in FIG. 2. When power is applied to respective light emitting cells, the turn-on voltage of each light emitting cell is determined depending on the current density of a corresponding light emitting cell, and the respective light emitting cells 11 in the LED 10 are formed on the one substrate through the same process to have the same size. For this reason, the respective light emitting cells 11 in the LED 10 have the same current density.

If AC with a frequency of 60 Hz is applied as the respective light emitting cells 11 in the LED 10 have the same turn-on voltage, the light emitting cells 11 are periodically turned on by the applied AC to thereby emit light.

That is, the respective light emitting cells 11 are turned on to emit light if the voltage applied by the AC with a frequency of 60 Hz is over the turn-on voltage, while the respective light emitting cells 11 suspend emitting light if the voltage applied by the AC with a frequency of 60 Hz is below the turn-on voltage.

At this time, as the respective light emitting cells 11 have the same turn-on voltage, all the light emitting cells 11 are turned on at a certain time. Then, the respective light emitting cells 11 stop emitting light at the instance when the voltage drops below the turn-on voltage after the light emitting cells 11 are turned on at the same turn-on voltage, which causes a flicker phenomenon to occur.

Such a flicker phenomenon may not be easily visible with the naked eyes. However, in the field of illuminator using AC power with a plurality of light emitting cells provided, a stable light source is required in reducing the flicker phenomenon if possible.

SUMMARY OF THE INVENTION

An object of the present invention is to provide an LED having a plurality of light emitting cells capable of reducing a flicker phenomenon generated because the turn-on voltages of the respective light emitting cells are similar to one another.

According to an aspect of the present invention, there is provided a light emitting diode (LED) operating under AC power, comprising a substrate; a buffer layer formed on the substrate; and a plurality of light emitting cells formed on the buffer layer to have different sizes and to be electrically isolated from one another, the plurality of light emitting cells being connected in series through metal wires.

Preferably, the plurality of light emitting cells are arranged so that adjacent ones of the respective light emitting cells electrically connected have different sizes and are repeated.

Preferably, the plurality of light emitting cells are arranged in two parallel rows, and polarities of the first and second rows are arranged to be opposite to each other.

More preferably, the light emitting cells arranged in each row have first and second sizes and alternately arranged adjacent to each other in the corresponding row, and when the light emitting cell formed at a position in the first row has the first size, the light emitting cell formed at a position in the second row corresponding to the position in the first row has the second size.

Preferably, each of the light emitting cells comprises an N-type semiconductor layer, an active layer and a P-type semiconductor layer, and the N-type and P-type semiconductor layers of adjacent ones of the light emitting cells are electrically connected in series through the metal wires.

According to another aspect of the present invention, there is provided a light emitting device having a plurality of LEDs arranged to operate under AC power, wherein each of the LEDs comprises a substrate; a buffer layer formed on the substrate; and a plurality of light emitting cells formed on the buffer layer to have different sizes and to be electrically isolated from one another, the plurality of light emitting cells being connected in series through metal wires.

Preferably, the respective LEDs comprise the same substrate in common.

According to the present invention, light emitting cells formed in an LED have different sizes, and thus have different turn-on voltages when light is emitted under AC power, so that times when the respective light emitting cells start emitting light are different to thereby effectively reduce a flicker phenomenon.

Further, the plurality of light emitting cells in an LED are arranged so that adjacent ones of the respective light emitting cells electrically connected have different sizes and an arrangement of the respective light emitting cells having different sizes are repeated, so that the intensity of light emitted from the LED is not largely different depending on positions in the LED, thereby uniformly emitting light throughout the LED.

Furthermore, a plurality of light emitting cells in an LED are arranged in two parallel rows, and the first and second rows are arranged so that the polarities thereof are opposite to each other, whereby a light emitting period of the LED can be more shorten when the LED emits light under AC power to thereby effectively reduce a flicker phenomenon.

In addition, in a state where a plurality of light emitting cells are arranged in two parallel rows and the first and second rows are arranged so that the polarities thereof are opposite to each other, the light emitting cells arranged in the respective rows with first and second sizes are alternately arranged adjacent to each other in the corresponding rows. When the light emitting cell formed at any position in the first row has the first size, the light emitting cell formed at a position in the second row corresponding to the position of the light emitting cell in the first row has the second size, whereby the light emitting cells in an LED with a confined area can be effectively arranged.

Moreover, according to the present invention, in a case where a plurality of LEDs having such configuration and characteristics are connected to one another to form a light emitting device, respective light emitting cells have different turn-on voltages when the respective LEDs emit light under AC power, so that times when the respective light emitting cells start emitting light are different. Accordingly, the light emitting device can be used for an illumination or light source in which a flicker phenomenon is effectively reduced.

Here, if the LEDs are formed on one substrate when the respective LEDs are formed in the light emitting device, it is possible to reduce entire fabrication processes of the light emitting device and to easily perform the operation of adjusting the turn-on voltage of each light emitting cell.

DETAILED DESCRIPTION OF THE ILLUSTRATED EMBODIMENTS

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

Figure 3:
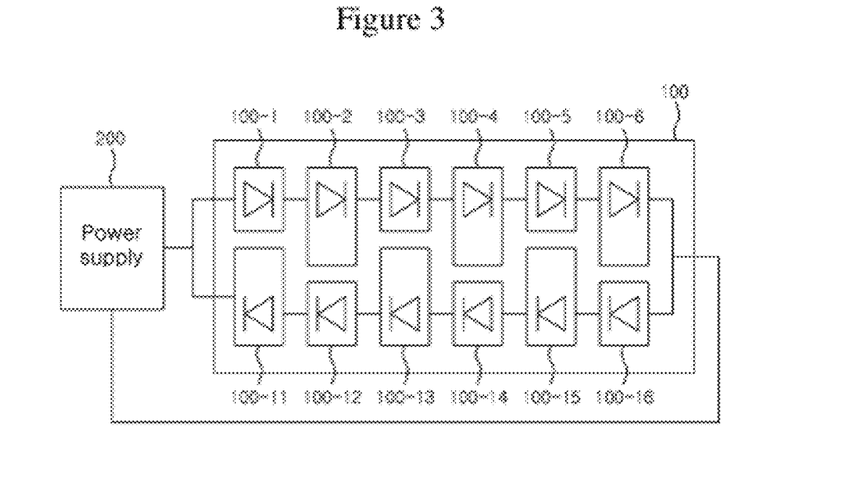
FIG. 3 is a view showing an arrangement of light emitting cells in an LED according to an embodiment of the present invention.

FIG. 3 is a view showing an arrangement of light emitting cells in an LED according to an embodiment of the present invention.

Referring to FIG. 3, an LED 100 can be connected to a power supply 200, and emits light under AC power supplied from the power supply 200.

The LED 100 has a plurality of light emitting cells 100-1 to 100-16.

The respective light emitting cells 100-1 to 100-16 are formed by laminating a multiple semiconductor layers on a substrate and electrically separating the multiple semiconductor layers into the cells. Each of the light emitting cells 100-1 to 100-16 has a light emitting structure of a PN junction. Adjacent ones of the respective light emitting cells may be electrically connected through metal wires.

The respective light emitting cells 100-1 to 100-16 may be arranged in various forms. In this embodiment, the light emitting cells 100-1 to 100-16 in the LED 100 are arranged in two parallel rows. The first and second rows are arranged to have polarities opposite to each other.

Hence, if AC power is applied to the LED 100 from the power supply 200, current flows into the first row in positive voltage intervals such that the light emitting cells 11 in the first row emit light, while current flows into the second row in negative voltage intervals such that the light emitting cells 11 in the second row emit light.

Therefore, the first and second rows alternately emit light.

The light emitting cells 100-1 to 100-6 in the first row may be formed to have various sizes. In this embodiment, each of the light emitting cells 100-1 to 100-6 has one of two sizes.

In the first row, first, third and fifth light emitting cells 100-1, 100-3 and 100-5 have a small size, and second, fourth and sixth light emitting cells 100-2, 100-4 and 100-6 have a large size.

Since the respective light emitting cells 100-1 to 100-6 are formed to have a light emitting structure by laminating semiconductor layers made of the same material on the same substrate, the current densities of the corresponding light emitting cells are different from each other when the same voltage is applied to the light emitting cells if the sizes of light emitting cells are different from each other.

If the current densities of the light emitting cells are different from each other, turn-on voltages at which the corresponding light emitting cells emit light when power is applied thereto are different from each other.

Figure 4:
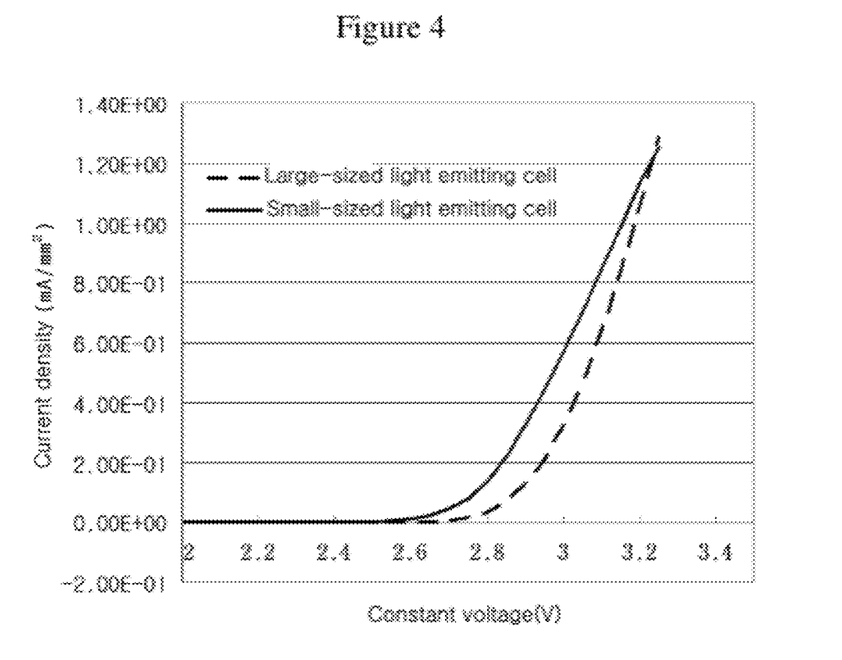
FIG. 4 is a graph showing turn-on voltages of the respective light emitting cells in the LED according to the embodiment of the present invention.

In general, when the same voltage is applied to a light emitting cell, the current density of the light emitting cell is larger as the size of the light emitting cell is smaller. Therefore, since a difference of turn-on voltages occurs between small- and large-sized light emitting cells as shown in FIG. 4, the turn-on voltage of the small-sized light emitting cell is lower than that of the large-sized light emitting cell, so that the small-sized light emitting cell emits light at a turn-on voltage lower than the large-sized light emitting cell.

When AC power is applied, light emitting cells emit light at the turn-on voltage or more, and stop emitting light at the turn-on voltage or less.

Hence, when AC power is applied, the small-sized light emitting cell is turned on to emit light earlier and maintains a light emitting state longer than the large-sized light emitting cell. That is, the small-sized light emitting cell has a light emitting time longer than the large-sized light emitting cell.

By such a principle, if AC power supplied from the power supply 200 is applied to the LED 100, the first, third and fifth light emitting cells 100-1, 100-3 and 100-5 have a lower turn-on voltage in the first row than the second, fourth and sixth light emitting cells 100-2, 100-4 and 100-6.

Accordingly, although the same AC power is applied, the first, third and fifth light emitting cells 100-1, 100-3 and 100-5 are turned on to emit light earlier and maintain a light emitting state longer than the second, fourth and sixth light emitting cells 100-2, 100-4 and 100-6.

Since small- and large-sized light emitting cells are alternately connected in series in the first row, adjacent ones of the respective light emitting cells start emitting light at different times and stop emitting light at different times. According to the embodiment of the present invention, a flicker phenomenon is remarkably reduced as compared with the arrangement of conventional light emitting cells with the same size.

The light emitting cells 100-11 to 100-16 in the second row in the LED 100 may also be formed to have various sizes. In this embodiment, the emitting cells 100-11 to 100-16 are formed to be different in size from the light emitting cells 100-1 to 100-6 corresponding thereto, respectively.

That is, in the first row, the first, third and fifth light emitting cells 100-1, 100-3 and 100-5 have a small size, and the second, fourth and sixth light emitting cells 100-2, 100-4 and 100-6 have a large size. On the other hand, in the second row, the eleventh, thirteenth and fifteenth light emitting cells 100-11, 100-13 and 100-15 have a large size, and the twelfth, fourteenth and sixteenth light emitting cells 100-12, 100-14 and 100-16 have a small size.

Light emitting cells in an LED with a confined area can be effectively arranged through such an arrangement.

Further, when the first and second rows alternately emit light through such an arrangement, the intensity of light emitted from the light emitting cells has little difference depending on the position of the light emitting cell in the LED, so that entire intensity thereof can be made uniform.

According to the present invention, a flicker phenomenon is remarkably reduced as compared with the arrangement of the conventional light emitting cells with the same size.

Figure 5:
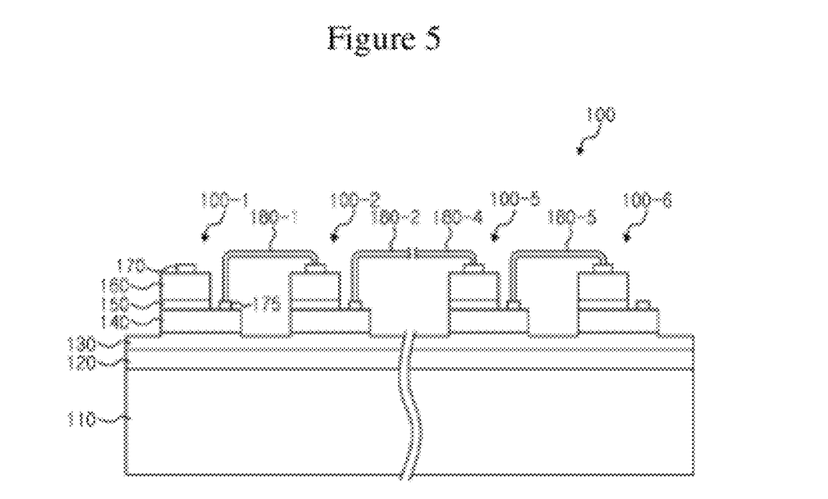
FIG. 5 is a sectional view illustrating a light emitting device according to the embodiment of the present invention.

FIG. 5 is a sectional view illustrating the light emitting device according to the embodiment of the present invention. For convenience, FIG. 5 is a sectional view illustrating the light emitting diodes arranged in the first row in the light emitting device in FIG. 3.

In addition, the plurality of light emitting cells 100-1 to 100-6 have different sizes from one another but only a cross section thereof is illustrated in this figure, so that the respective light emitting cells are shown to have the same width. However, although the respective light emitting cells have the same width, the lengths of the light emitting cells that are not shown in this figure are different from one another as shown in FIG. 3.

Referring to FIG. 5, the light emitting device of the present invention comprises a heat conductive substrate 110, a buffer layer 120 formed on the heat conductive substrate 110, a different type semiconductor layer repeated film 130 having a multi-layered structure formed by alternately laminating N-type and P-type semiconductor layers repeatedly, the plurality of light emitting cells 100-1 to 100-6 patterned on the different semiconductor layer repeated film 130, and metal wires 180-1 to 180-5 for serially connecting the plurality of light emitting cells 100-1 to 100-6 to one another.

The heat conductive substrate 110 is a substrate made of a material with thermal conductivity relatively higher than a sapphire substrate. A SiC, Si, Ge, GeSi, AlN, or metal substrate may be used as the heat conductive substrate 110.

The buffer layer 120 is used to reduce lattice mismatch between the heat conductive substrate 110 and semiconductor layers to be formed thereon. Further, in some embodiments of the present invention, the buffer layer 120 is used to isolate the light emitting cells 100-1 to 100-6 from the heat conductive substrate 110. The light emitting cells 100-1 to 100-6 are electrically spaced apart from one another, so that the buffer layer 120 is formed of a semi-insulating material layer.

In this embodiment, the buffer layer 120 may be an AlN or semi-insulating GaN layer. Since an undoped AlN generally has an insulating property, the AlN may be an undoped AlN. Meanwhile, an undoped GaN generally has an N-type semiconductor or semi-insulating property depending on a growth method and a substrate material. Hence, when the undoped GaN has a semi-insulating property, the semi-insulating GaN is an undoped GaN. On the other hand, when the undoped GaN has an N-type semiconductor property, acceptors are doped to cancel the N-type semiconductor property. The acceptor may be alkaline metal, alkaline earth metal or transition metal, particularly Fe or Cr.

A method of forming a semi-insulating GaN on a sapphire substrate is disclosed in Applied Physics Letters published on Jul. 15, 2002, entitled "Growth of Fe doped semi-insulating GaN by metalorganic chemical vapor deposition" by Heikman et al. According to Heikman et al., a semi-insulating GaN layer is formed on a sapphire substrate using an MOCVD technique in which ferrocene ($Cp_2Fe$) is used as a precursor.

In general, an undoped GaN formed on a sapphire substrate using the MOCVD technique becomes an N-type GaN. This is because remaining oxygen atoms function as donors in a GaN layer. Hence, since the donors are cancelled by being doped with a metallic material that functions as acceptors, such as Fe, a semi-insulating GaN can be formed.

The method of forming a semi-insulating GaN by being doped with acceptors may be equally applied to the embodiment of the present invention. For example, the undoped GaN formed on a SiC substrate may become an N-type GaN due to impurities including Si or the like. Thus, the semi-insulating GaN buffer layer 120 may be formed by being doped with a metallic material such as Fe. At this time, it is unnecessary to dope the buffer layer 120 with acceptors throughout the entire thickness thereof. That is, the buffer layer 120 may be partially doped with acceptors such as Fe by confining a portion of the thickness thereof.

As shown in this figure, the buffer layer 120 may be continuous between the light emitting cells 100-1 to 100-6. However, the buffer layer 120 may be discrete.

The different semiconductor layer repeated film 130 is formed by alternately laminating N-type and P-type semiconductor layers repeatedly.

The number of pairs of alternately laminated N-type and P-type semiconductor layers ranges from 2 to 500.

In the different semiconductor layer repeated film 130, the N-type semiconductor layer may be a GaN-based layer doped with N-type impurities, e.g., an N-type $Al_xIn_yGa_{1-x-y}N$ ($0 \leq x$, y, $x+y \leq 1$). However, the present invention is not limited thereto, but may include various semiconductor layers. Further, the P-type semiconductor layer may be a GaN-based layer doped with P-type impurities, e.g., a P-type $Al_xIn_yGa_{1-x-y}N$ ($0 \leq x$, y, $x+y \leq 1$). However, the present invention is not limited thereto, but may include various semiconductor layers. The N-type and P-type semiconductor layers may be an $In_xGa_{1-x}N$ ($0 \leq x \leq 1$) layer or $Al_xGa_{1-x}N$ ($0 \leq x \leq 1$).

Alternatively, in the different semiconductor layer repeated film 130, the N-type semiconductor layer may be formed by being doped with Si, and the P-type semiconductor layer may be formed by being doped with Zn or Mg.

The N-type and P-type semiconductor layers of the different semiconductor layer repeated film 130 are alternately laminated, so that a large potential barrier is formed in a contact surface between the N-type and P-type semiconductor layers. Therefore, current does not flow between adjacent semiconductor layers, thereby causing an insulating effect.

That is, the light emitting cells 100-1 to 100-6 and the conductive substrate 110 are electrically insulated from each other, so that leakage current that may be generated through the conductive substrate 110 can be effectively prevented due to the insulating effect of the different semiconductor layer repeated film 130.

Moreover, the light emitting cells 100-1 to 100-6 can be electrically isolated from one another due to the insulating effect of the different semiconductor layer repeated film 130.

The operation of growing N-type and P-type semiconductor layers in the different semiconductor layer repeated film 130 is more easily performed than the operation of growing AlN in the buffer layer 120.

Meanwhile, each of the plurality of the light emitting cells 100-1 to 100-6 includes a PN-junction nitride semiconductor layer.

In this embodiment, each of the light emitting cells 100-1 to 100-6 comprises an N-type semiconductor layer 140, an active layer 150 formed on a predetermined region of the N-type semiconductor layer 140, and a P-type semiconductor layer formed on the active layer 150. At least a portion of the top surface of the N-type semiconductor layer 140 is exposed. Ohmic metal layers 170 and 175 may be formed on the N-type and P-type semiconductor layers 140 and 160, respectively. A semi-metal layer or a highly concentrated N-type semiconductor tunneling layer with a concentration of $1 \times 10^{19}$ to $1 \times 10^{22}/cm^3$ may be formed on the N-type or P-type semiconductor layer 140 or 160. Then, a transparent electrode layer (not shown) may be further formed thereon.

The N-type semiconductor layer 140 may be a GaN-based layer doped with N-type impurities, e.g., an N-type $Al_xIn_yGa_{1-x-y}N$ ($0 \leq x, y, x+y \leq 1$). However, the present invention is not limited thereto, but may include various semiconductor layers. Further, the P-type semiconductor layer 160 may be a GaN-based layer doped with P-type impurities, e.g., a P-type $Al_xIn_yGa_{1-x-y}N$ ($0 \leq x, y, x+y \leq 1$). However, the present invention is not limited thereto, but may include various semiconductor layers.

Each of the N-type and P-type semiconductor layers 140 and 160 may be an $In_xGa_{1-x}N$ ($0 \leq x \leq 1$) or $Al_xGa_{1-x}N$ ($0 \leq x \leq 1$) layer.

The N-type semiconductor layer 140 may be formed by being doped with Si, and the P-type semiconductor layer 160 may be formed by being doped with Zn or Mg.

The active layer 150, which is a region in which electrons and holes are recombined, includes InGaN. The wavelength of light emitted from a light emitting cell varies depending on the kind of a material of the active layer 150. The active layer 150 may be a multi-layered film having quantum well layers and barrier layers repeatedly formed. The barrier well layer and quantum well layer may be binary or quaternary compound semiconductor layers expressed by a general formula $Al_xIn_yGa_{1-x-y}N$ ($0 \leq x, y, x+y \leq 1$).

The light emitting cells are connected in series through the metal wires 180-1 to 180-5. In this embodiment, the light emitting cells 100-1 to 100-6 are connected in series as many as can be driven by an AC power supply through the metal wires. That is, the number of light emitting cells to be connected in series is limited by AC driving voltage/current applied to the light emitting device and voltage required in driving a single light emitting cell. For example, about 67 light emitting cells each of which is driven with 3.3V can be connected in series under an AC voltage of 220V. Further, about 34 light emitting cells each of which is driven with 3.3V can be connected in series under an AC voltage of 110V.

As shown in FIG. 5, in the light emitting device having the six light emitting cells 100-1 to 100-6 connected in series, the N-type semiconductor layer 140 of the first light emitting cell 100-1 is connected to the P-type semiconductor layer 160 of the second light emitting cell 100-2 through the first metal wire 180-1, the N-type semiconductor layer 140 of the second light emitting cell 100-2 is connected to the P-type semiconductor layer (not shown) of the third light emitting cell (not shown) through the second metal wire 180-2, the N-type semiconductor layer (not shown) of the fourth light emitting cell (not shown) is connected to the P-type semiconductor layer 160 of the fifth light emitting cell 100-5 through the fourth metal wire 180-4, and the N-type semiconductor layer 140 of the fifth light emitting cell 100-5 is connected to the P-type semiconductor layer 160 of the sixth light emitting cell 100-6 through the fifth metal wire 180-5.

As disclosed in PCT Patent Publication No. WO 2004/023568 (A1), the serially connected light emitting cells form an LED array. Meanwhile, the light emitting device have two LED arrays connected to each other in reverse parallel to be used for illumination under AC power. P-type and N-type pads (not shown) to be electrically connected to an AC power source may be formed on the P-type semiconductor layer 160 of the first light emitting cell 100-1 and the N-type semiconductor layer 140 of the sixth light emitting cell 100-6, respectively.

Hereinafter, a method of fabricating a light emitting device having a plurality of light emitting cells with different sizes will be described.

Figure 6:
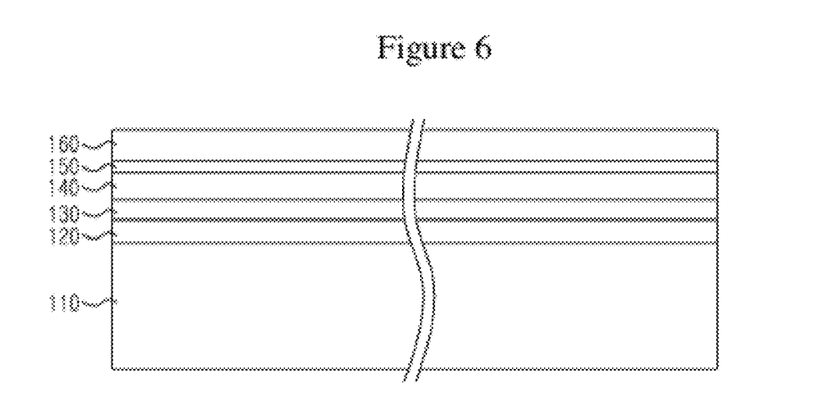
FIGS. 6 to 8 are sectional views illustrating a method of fabricating a light emitting device according to an embodiment of the present invention.
Figure 7:
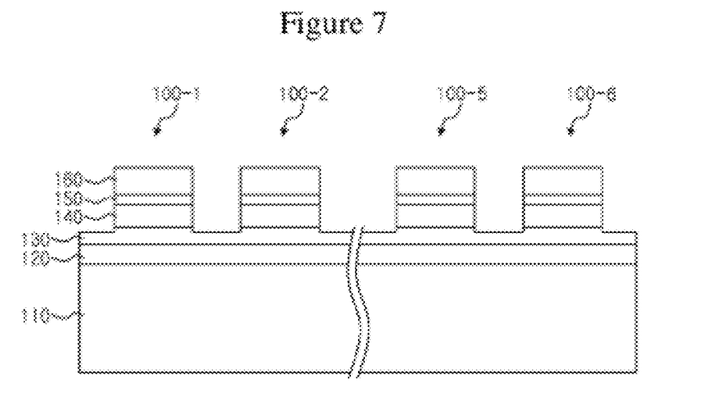
Figure 8:
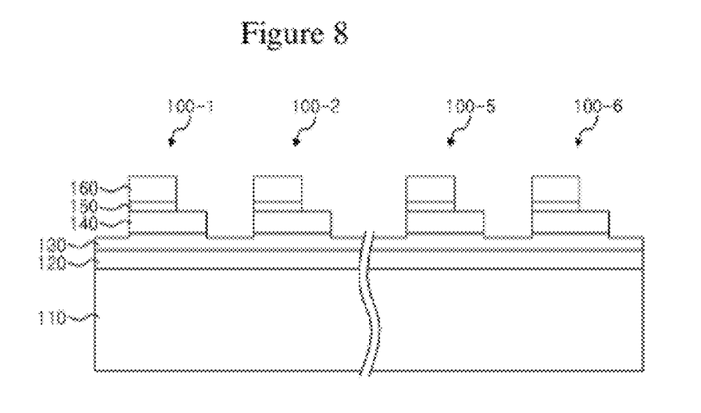

FIGS. 6 to 8 are sectional views illustrating a method of fabricating a light emitting device according to an embodiment of the present invention.

Referring to FIG. 6, a buffer layer 120 is formed on a heat conductive substrate 110. The heat conductive substrate 110 may be an AlN or SiC substrate. Further, the SiC substrate may be a semi-insulating or N-type substrate.

In general, a SiC single crystalline substrate has properties of an N-type semiconductor. This is because nitrogen (N) contained in the SiC substrate functions as a donor. Therefore, a semi-insulating SiC single crystal can be grown by being doped with acceptors, e.g., vanadium. Meanwhile, a method of growing a semi-insulating SiC single crystal without being doped with vanadium is disclosed in U.S. Pat. No. 6,814,801. The semi-insulating SiC substrate may be provided using such methods.

In order to perform a semiconductor growth process for forming a light emitting cell, the buffer layer 120 is formed using a method such as MOCVD, MBE, HVPE or the like. The buffer layer 120 may be an AlN or semi-insulating GaN layer. The semi-insulating GaN layer may be an undoped GaN or a GaN layer doped with acceptors. The acceptor may be alkaline metal, alkaline earth metal or transition metal, particularly Fe or Cr.

At this time, since the buffer layer 120 may be formed to have a thickness to the extent that the buffer layer functions as a middle layer for performing the semiconductor growth process for forming a light emitting cell, it is not required to form the buffer layer up to the thickness for providing an insulating property.

A different semiconductor layer repeated film 130 is formed on the buffer layer 120. The different semiconductor layer repeated film 130 is formed to have a multi-layered structure by alternately laminating N-type and P-type semiconductor layers repeatedly.

The different semiconductor layer repeated film 130 may be continuously formed in the same process chamber. Each of the N-type and P-type semiconductor layers in the different semiconductor layer repeated film 130 may be formed using a method, such as MOCVD, MBE or HVPE, and may be formed to have a multi-layered structure.

An N-type semiconductor layer 140, an active layer 150 and a P-type semiconductor layer 160 are formed on the different semiconductor layer repeated film 130. These semiconductor layers 140, 150 and 160 may be continuously formed in the same process chamber. Each of the N-type semiconductor layer 140, the active layer 150 and the P-type semiconductor layer 160 may be formed using a method, such as MOCVD, MBE or HVPE, and may be formed to have a multi-layered structure. A semi-metal layer or a highly concentrated N-type semiconductor tunneling layer with a concentration of $1\times10^{19}$ to $1\times10^{22}$/cm$^3$ may be formed on the N-type or P-type semiconductor layer 140 or 160, and then, a transparent electrode layer (not shown) may be further formed thereon.

Referring to FIG. 7, the P-type semiconductor layer 160, the active layer 150 and the N-type semiconductor layer 140 are patterned, thereby forming light emitting cells 100-1 to 100-6 isolated from one another.

At this time, the respective light emitting cells 100-1 to 100-6 have the same width, but are patterned and isolated to have different lengths as shown in FIG. 3. Only the same width is expressed in FIG. 7.

The respective layers may be patterned using a photolithography and etching technique. For example, a photoresist pattern is formed on the P-type semiconductor layer 160, and the P-type semiconductor layer 160, the active layer 150 and the N-type semiconductor layer 140 are sequentially etched using the photoresist pattern as an etching mask. Accordingly, the light emitting cells 100-1 to 100-6 isolated from one another are formed.

At this time, the different semiconductor layer repeated film 130 may be etched to thereby expose a portion thereof.

In order to prevent electrical insulation between the respective light emitting cells 100-1 to 100-6 and leakage current through the heat conductive substrate 110, two or more pairs of N-type and P-type semiconductor layers in the different semiconductor layer repeated film 130 are etched from the top thereof, thereby partially exposing the different semiconductor layer repeated film 130.

This is the reason why if the number of laminated N-type and P-type semiconductor layers is two or more pairs, an insulating effect can be sufficiently expected.

As described above, the etching is performed so that the different semiconductor layer repeated film 130 is partially exposed, thereby electrically isolating the light emitting cells 100-1 to 100-6 from one another.

Referring to FIG. 8, the P-type semiconductor 160 and the active layer 150 of the respective light emitting cells 100-1 to 100-6 isolated from one another are patterned, thereby partially exposing the top surface of the N-type semiconductor layer 140. The patterning process may be performed using a photolithography and etching process. That is, a photoresist pattern is formed on the substrate 110 having light emitting cells 100-1 to 100-*n* isolated from one another, and the P-type semiconductor layer 160 and the active layer 150 are partially etched using the photoresist pattern as an etching mask. As a result, the N-type semiconductor layer 140 is exposed at the etched portions of the P-type semiconductor layer 160 and the active layer 150.

The etching process may be performed through a wet or dry etching process. The dry etching process may be a dry etching process using plasma.

After the etching process, P-type and N-type ohmic metal layers 170 and 175 are formed on the P-type and N-type semiconductor layers 160 and 140, respectively.

The ohmic metal layers 170 and 175 may be formed by performing a metal deposition process after opening regions in which the ohmic metal layers 170 and 175 will be formed using a photoresist pattern (not shown). P-type and N-type ohmic metal layers 170 and 175 may be formed through the same process or through separate processes. The ohmic metal layers 170 and 175 may be formed of at least one material of Pb, Sn, Au, Ge, Cu, Bi, Cd, Zn, Ag, Ni and Ti.

Thereafter, the N-type and P-type ohmic metal layers 175 and 170 of adjacent ones of the respective light emitting cells are connected through the metal wires 180-1 to 180-5, thereby completing the light emitting device 100 shown in FIG. 5.

The metal wires 180-1 to 180-5 may be formed through an air bridge or step-cover process.

The air bridge process is disclosed in PCT Patent Publication No. WO 2004/203568(A1) and will be briefly described. First, a first photoresist pattern having openings for exposing the ohmic metal layers 170 and 175 is formed on the substrate having the light emitting cells and the ohmic metal layers 170 and 175 formed thereon. Thereafter, a metallic material layer is formed to be thin using an e-beam evaporation technique or the like. The metallic material layer is formed on an entire surface of the openings and the first photoresist pattern. Subsequently, a second photoresist pattern is formed to expose regions between adjacent ones of the respective light emitting cells to be connected and the metallic material layer of the openings. After gold or the like is formed using a plating technique, the first and second photoresist patterns are removed by means of a solution such as solvent. As a result, wires for connecting the adjacent light emitting cells are left, and the metallic material layer and the photoresist patterns are all removed.

Meanwhile, the step-cover process includes the step of forming an insulating layer on the substrate having the light emitting cells and the ohmic metal layers. The insulating layer is patterned using a photolithography and etching process to thereby form openings for exposing the ohmic metal layers 170 and 175 on the P-type and N-type semiconductor layers. Subsequently, a metal layer, with which the openings are filled and which covers a top surface of the insulating layer, is formed using an e-beam evaporation technique or the like. Thereafter, the metal layer is patterned using a photolithography and etching process to thereby form wires for connecting the adjacent light emitting cells. The step-cover process may vary. If the step-cover process is applied, wires are supported by an insulating layer, so that the reliability of the wires can be improved.

Meanwhile, P-type and N-type pads for being connected to an AC power source are formed on the light emitting cells 100-1 and 100-6 positioned at both ends of the light emitting device, respectively.

Although the light emitting cells are arrange in a line in these figures, it is for the purpose of convenience for illustration. The light emitting cells may be arranged in various forms on a plane as described in PCT Patent Publication No. WO 2004/023568(A1).

The present invention has been described with reference to the preferred embodiments and specific modifications. However, it will be understood by those skilled in the art that a plurality of various other embodiments different from the aforementioned ones are also included in the spirit and scope of the present invention.

For example, in the embodiment of the present invention, the configuration and characteristics of an LED has been described, in which light emitting cells have different sizes and thus different turn-on voltages from each other when emitting light under AC power, so that times when the respective light emitting cells start emitting light are different to thereby reduce a flicker phenomenon. However, when a plurality of LEDs each of which has such configuration and characteristics are connected to one another and emit light under AC power, times when the respective light emitting cells start emitting light are different to thereby effectively reduce a flicker phenomenon since the respective light emitting cells have different turn-on voltages from each other. Accordingly, various light emitting devices can be fabricated.

Further, it has been described in the embodiment of the present invention that when a plurality of light emitting cells are formed in an LED, the plurality of light emitting cells are formed on one substrate. Even when LEDs are formed in a light emitting device, a process can also be performed such that the respective LEDs are formed on one substrate.

Furthermore, it has been described in the embodiment of the present invention that when a plurality of light emitting cells are formed in an LED, the light emitting cells are different in size from each other. Here, the description that the light emitting cells are different in size may be additionally interpreted as the means that areas occupied by the corresponding light emitting cells are different. In addition, it can be also interpreted in the same scope that numerical dimensions designed when light emitting cells are fabricated may vary so that current densities are different and thus turn-on voltages are different when the same voltage is applied.

What is claimed is:

1. A light emitting device, comprising:
   a plurality of light emitting cells arranged on a substrate; and
   a first serial array comprising at least two electrically connected light emitting cells of the plurality of light emitting cells,
   wherein the at least two light emitting cells comprise semiconductor layers made of the same material, the at least two light emitting cells configured to emit light having substantially the same wavelength,
   wherein the at least two light emitting cells have different sizes, and
   wherein turn-on voltages and light emitting initiation timings of the at least two light emitting cells are different according to the different sizes.

2. The light emitting device of claim 1, further comprising a second serial array comprising at least another two electrically connected light emitting cells of the plurality of light emitting cells,
   wherein the at least another two light emitting cells have different sizes.

3. The light emitting device of claim 2, wherein the first serial array and the second serial array are connected to each other in parallel.

4. The light emitting device of claim 3, wherein the light emitting device is to emit light during both a forward bias cycle and a reverse bias cycle of an alternating current (AC) power source.

5. The light emitting device of claim 2, wherein the first serial array and the second serial array comprise an equal number of same sized light emitting cells.

6. The light emitting device of claim 1, wherein the plurality of light emitting cells are arranged in a substantially rectangular shape on the substrate.

7. The light emitting device of claim 6, wherein the plurality of light emitting cells are arranged such that a smaller sized light emitting cell is disposed adjacent to a larger sized light emitting cell.

8. The light emitting device of claim 7, wherein one larger sized light emitting cell is disposed directly between two smaller sized light emitting cells in the first serial array.

9. The light emitting device of claim 6, wherein one smaller sized light emitting cell is disposed directly between two larger sized light emitting cells in the first serial array.

10. The light emitting device of claim 6, wherein the plurality of light emitting cells are arranged such that a larger sized light emitting cell is disposed adjacent to smaller sized light emitting cells.

11. The light emitting device of claim 1, further comprising:
    a second serial array comprising at least two electrically connected light emitting cells of the plurality of light emitting cells,
    wherein the second serial array is connected to the first serial array in parallel, and
    wherein at least one light emitting cell of the first serial array comprises a different size from at least one light emitting cell of the second serial array.

12. The light emitting device of claim 11, wherein the at least one light emitting cell of the first serial array and the at least one light emitting cell of the second serial array are arranged adjacent to each other.

13. The light emitting device of claim 12, wherein the at least one light emitting cell of the first serial array comprises the same size as a light emitting cell adjacent to the at least one light emitting cell of the second serial array.

14. The light emitting device of claim 11, wherein the first serial array is connected in inverse parallel to the second serial array.

15. A light emitting device, comprising:
a plurality of light emitting cells arranged on a substrate; and
a first serial array comprising at least two electrically connected light emitting cells of the plurality of light emitting cells,
wherein the at least two light emitting cells comprise a first type semiconductor layer arranged on the substrate, a second type semiconductor layer arranged between the first type semiconductor layer and the substrate, and an active layer interposed between the first type semiconductor layer and the second type semiconductor layer,
wherein the at least two light emitting cells comprise the first type semiconductor layer made of the same material, the second type semiconductor layer made of the same material, and the active layer made of the same material, the at least two light emitting cells configured to emit light having substantially the same wavelength,
wherein the at least two light emitting cells comprise different sizes, and
wherein turn-on voltages and light emitting initiation timings of the at least two light emitting cells are different according to the different sizes.

16. The light emitting device of claim 15, wherein the at least two light emitting cells comprise the same width and comprise different lengths.

17. The light emitting device of claim 15, wherein the first type semiconductor layer and the second type semiconductor layer comprise at least one of: $In_xGa_{1-x}N$, where ($0 \leq x \leq 1$); $Al_xGa_{1-x}N$, where($0 \leq x \leq 1$); and $Al_xIn_yGa_{(1-x-y)}N$, where ($0 \leq x, y, x+y \leq 1$).

18. The light emitting device of claim 1, wherein the at least two light emitting cells comprise the same layer arrangement.

19. A light emitting device, comprising:
a plurality of light emitting cells arranged on a substrate; and
a first serial array comprising at least two electrically connected light emitting cells of the plurality of light emitting cells,
wherein the at least two light emitting cells comprise semiconductor layers made of the same material, the at least two light emitting cells configured to emit light having substantially the same wavelength,
wherein the at least two light emitting cells have different sizes.

* * * * *